(12) United States Patent
Lee

(10) Patent No.: US 7,374,953 B2
(45) Date of Patent: May 20, 2008

(54) FERROELECTRIC RANDOM ACCESS MEMORIES (FRAMS) HAVING LOWER ELECTRODES RESPECTIVELY SELF-ALIGNED TO NODE CONDUCTIVE LAYER PATTERNS AND METHODS OF FORMING THE SAME

(75) Inventor: Moon-Sook Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 369 days.

(21) Appl. No.: 11/202,985

(22) Filed: Aug. 12, 2005

(65) Prior Publication Data

US 2006/0033134 A1 Feb. 16, 2006

(30) Foreign Application Priority Data

Aug. 16, 2004 (KR) .................... 10-2004-0064449

(51) Int. Cl.
*H01L 21/00* (2006.01)
*H01L 21/8242* (2006.01)
*H01L 31/062* (2006.01)
*H01L 31/113* (2006.01)

(52) U.S. Cl. .......................... 438/3; 438/240; 257/295
(58) Field of Classification Search .................... 438/3, 438/240; 257/295
See application file for complete search history.

(56) References Cited

U.S. PATENT DOCUMENTS

| 5,710,075 | A | * | 1/1998 | Tseng | 438/254 |
|---|---|---|---|---|---|
| 6,268,260 | B1 | | 7/2001 | Keil | 438/396 |
| 6,573,542 | B2 | | 6/2003 | Bruchhaus et al. | 257/295 |
| 6,762,110 | B1 | * | 7/2004 | Masuda | 438/396 |
| 2001/0019147 | A1 | * | 9/2001 | De Boer et al. | 257/309 |
| 2003/0205734 | A1 | * | 11/2003 | Lee et al. | 257/200 |

FOREIGN PATENT DOCUMENTS

| KR | 1998-023065 | 7/1998 |
|---|---|---|
| KR | 1998-060612 | 10/1998 |
| KR | 10-2003-0002744 | 1/2003 |
| KR | 2003-0002093 | 1/2003 |
| KR | 10-2003-0032459 | 4/2003 |

* cited by examiner

*Primary Examiner*—Mark A. Robinson
*Assistant Examiner*—Tanika Warrior
(74) *Attorney, Agent, or Firm*—Myers Bigel Sibley & Sajovec, PA

(57) ABSTRACT

A ferroelectric random access memory (FRAM) includes a semiconductor substrate and an interlayer insulating layer on the substrate. A diffusion preventive layer is on the interlayer insulating layer. The diffusion preventive layer and the interlayer insulating layer have two node contact holes formed therein. Node conductive layer patterns are aligned with the node contact holes, respectively, and are disposed so as to protrude upward from the diffusion preventive layer. Lower electrodes are disposed on the diffusion preventive layer that cover the node conductive layer patterns, respectively. Thicknesses of the lower electrodes are gradually reduced from a line extending from upper surfaces of the node conductive layer patterns toward the diffusion preventive layer.

10 Claims, 18 Drawing Sheets

FERROELECTRIC RANDOM ACCESS MEMORIES (FRAMS) HAVING LOWER ELECTRODES RESPECTIVELY SELF-ALIGNED TO NODE CONDUCTIVE LAYER PATTERNS AND METHODS OF FORMING THE SAME

CROSS-REFERENCE TO RELATED APPLICATION

This application claims the benefit under 35 USC § 119 of Korean Patent Application No. 10-2004-0064449, filed Aug. 16, 2004, the disclosure of which is hereby incorporated herein by reference in its entirety.

BACKGROUND OF INVENTION

1. Technical Field

The invention relates to ferroelectric random access memories and methods of forming the same, and more particularly, to ferroelectric random access memories having lower electrodes respectively self-aligned to node conductive layer patterns and methods of forming the same.

2. Discussion of the Related Art

Generally, a ferroelectric random access memory (FRAM) has a plurality of capacitors. Each capacitor typically has the same structure as that of a dynamic random access memory (DRAM). That is, the capacitor includes a lower electrode, a dielectric layer, and an upper electrode, which are sequentially stacked on a semiconductor substrate. The upper electrode and the dielectric layer are formed to cover the lower electrode. The dielectric layer is not a composite layer including a silicon oxide ($SiO_2$) layer and a silicon nitride ($Si_3N_4$) layer, but a ferroelectric layer. The lower electrode may have various shapes to increase its data storage capacity.

However, the lower electrode may be more difficult to form on the semiconductor substrate by using semiconductor fabrication processes in which the design rule of the FRAM has gradually been reduced. This is because a photolithography process may have a limitation in defining the lower electrodes on a photoresist layer with the reduction of the design rule of the FRAM. Furthermore, as the limitation of the photolithography process may influence a subsequent etching process, all the semiconductor fabrication processes related to the lower electrode may become more difficult to perform on the semiconductor substrate. Considering that the reduction of the design rule of the FRAM is generally unavoidable due to market demands for semiconductor devices, it may be required that the lower electrodes be embodied on a semiconductor substrate by providing ways to overcome the limitation of the photolithography process.

U.S. Pat. No. 6,268,260 to Douglas L. Keil (the '260 patent) discloses methods of forming memory cell capacitor plates in memory cell capacitor structure. According to the '260 patent, the method includes forming a sacrificial layer. An opening is formed in the sacrificial layer. An electrode material layer is formed on the sacrificial layer to partially fill the opening. Then, a portion of the electrode material layer is removed so that the remaining electrode material layer is down to at least about a level of the top surface of the sacrificial layer to define a memory cell capacitor plate. The memory cell capacitor plate may function as a lower electrode of a capacitor. Then, the sacrificial layer is removed.

However, the methods include forming the openings by performing photolithography and etching processes. The opening may not be formed in the sacrificial layer due to limits in performing the photolithography and etching processes as the design rule of a semiconductor device is gradually reduced. Further, the methods may involve many semiconductor fabrication processes, including forming the sacrificial layer to define the memory cell capacitor plate. This factor may be one reason for the increase in fabricating cost for a semiconductor device.

SUMMARY OF THE INVENTION

According to some embodiments of the invention, a ferroelectric random access memory (FRAM) includes a semiconductor substrate and an interlayer insulating layer on the substrate. A diffusion preventive layer is on the interlayer insulating layer. The diffusion preventive layer and the interlayer insulating layer have two node contact holes formed therein. Node conductive layer patterns are aligned with the node contact holes, respectively, and are disposed so as to protrude upward from the diffusion preventive layer. Lower electrodes are disposed on the diffusion preventive layer that cover the node conductive layer patterns, respectively. Thicknesses of the lower electrodes are gradually reduced from a line extending from upper surfaces of the node conductive layer patterns toward the diffusion preventive layer.

The present invention may also be embodied as methods of forming ferroelectric random access memories (FRAMS) having lower electrodes respectively self-aligned to node conductive layer patterns.

BRIEF DESCRIPTION OF THE DRAWINGS

Other features of the present invention will be more readily understood from the following detailed description of specific embodiments thereof when read in conjunction with the accompanying drawings, in which.

DETAILED DESCRIPTION OF EMBODIMENTS

Figure 1:
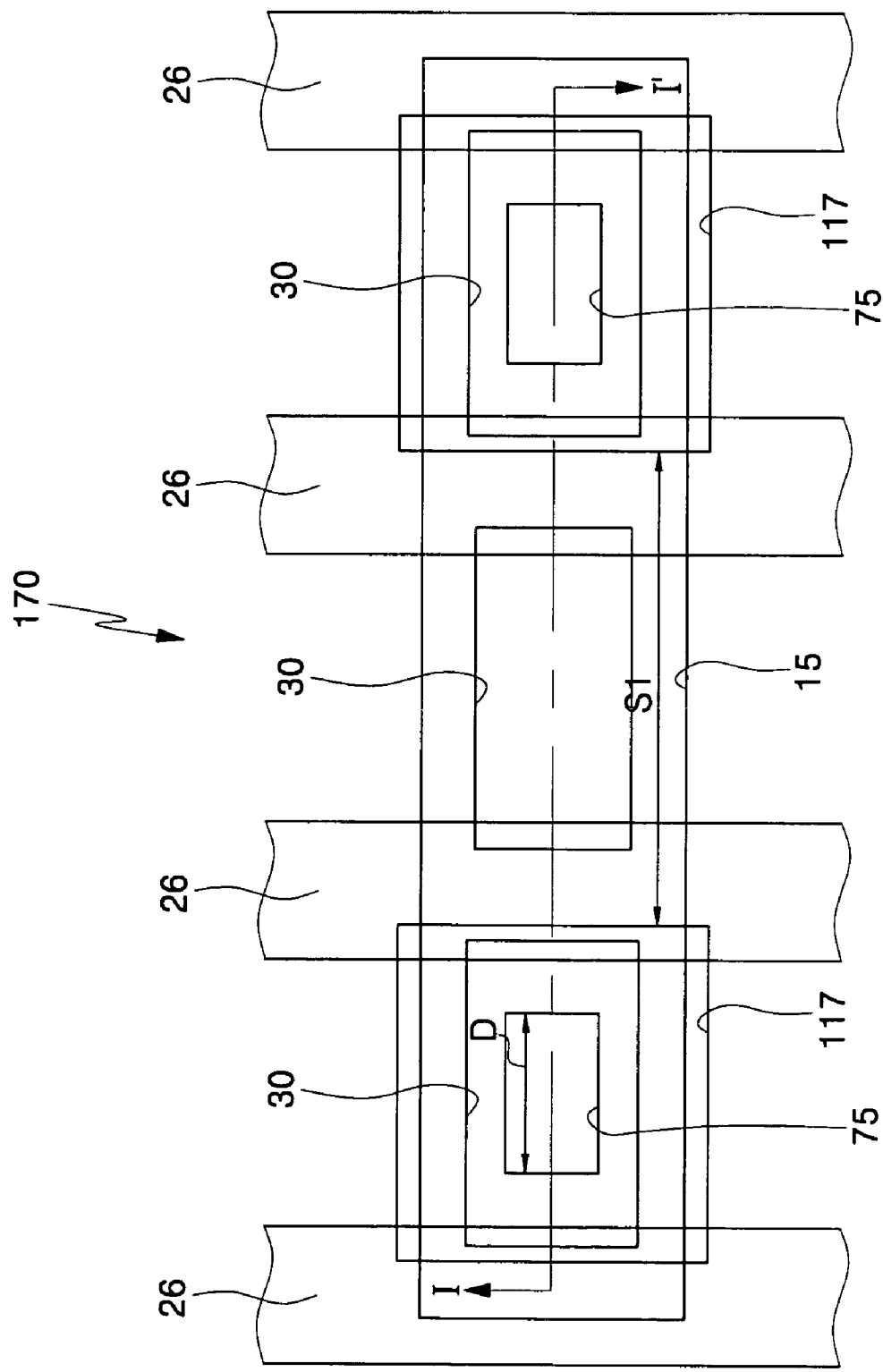
FIG. 1 is a layout diagram illustrating a ferroelectric random access memory (FRAM) according to some embodiments of the invention.

The invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout the description of the figures.

It will be understood that when an element is referred to as being "on" another element, it can be directly on the other element or intervening elements may be present. In contrast, when an element is referred to as being "directly on" another element, there are no intervening elements present. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another. For example, a first thin film could be termed a second thin film, and, similarly, a second thin film could be termed a first thin film without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the figures. It will be understood that relative terms are intended to encompass different orientations of the device in addition to the orientation depicted in the figures. For example, if the device in one of the figures were turned over, elements described as being on the "lower" side of other elements would then be oriented on "upper" sides of the other elements. The exemplary term "lower," can therefore, encompass both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein, but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

Figure 2:
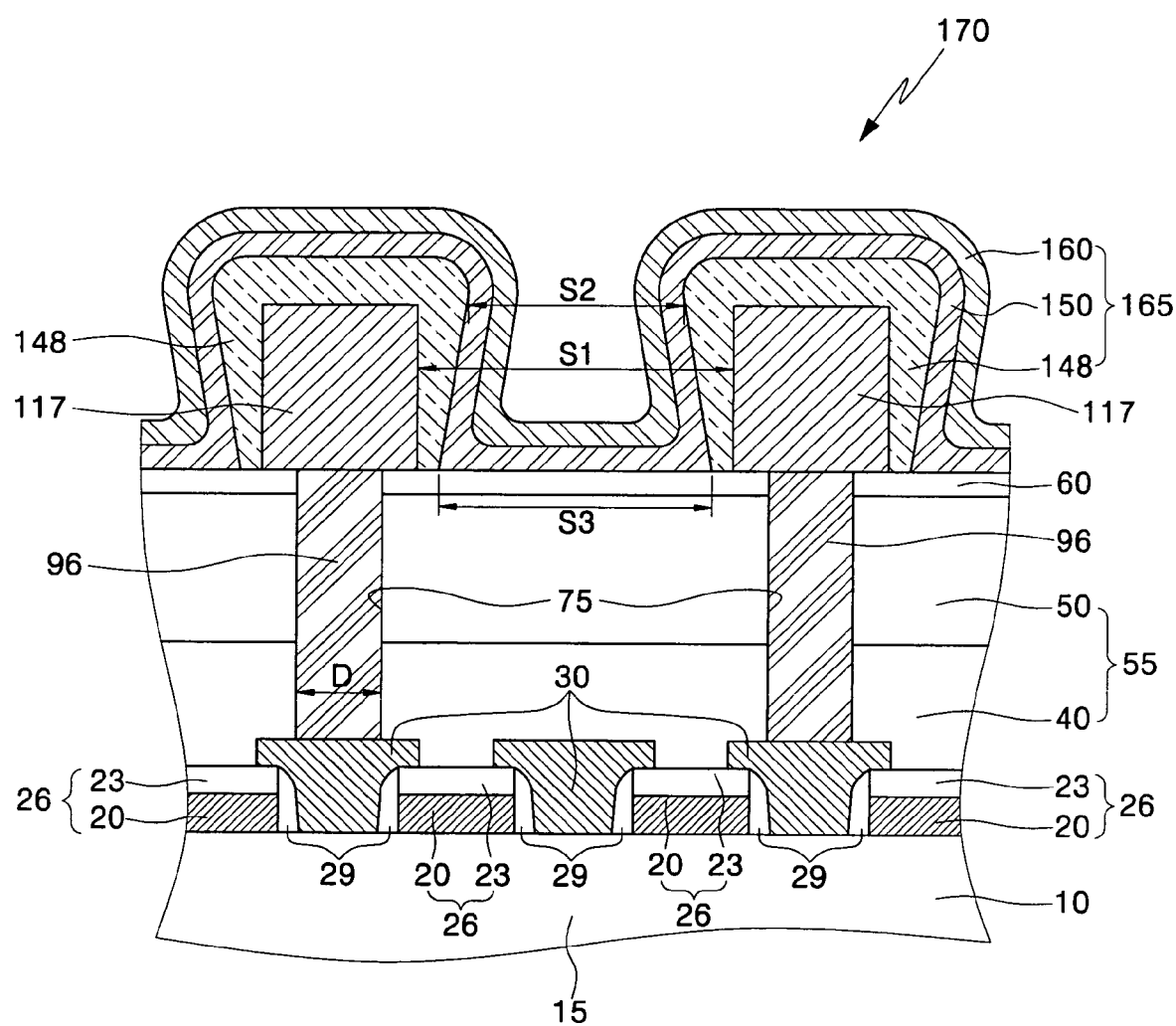
FIG. 2 is a cross-sectional view illustrating a FRAM taken along line I-I' of FIG. 1 according to some embodiments of the invention.

FIG. 1 is a layout showing a ferroelectric random access memory (FRAM) according to some embodiments of the present invention, and FIG. 2 is a cross-sectional view taken along line I-I' of FIG. 1 showing a FRAM according to some embodiments of the present invention. Referring to FIGS. 1 and 2, in a ferroelectric random access memory (FRAM) 170, two node contact holes 75 are disposed on a semiconductor substrate 10 of an active region 15. The node contact holes 75 are disposed to penetrate a pad insulating layer 40, a buried insulating layer 50, and a diffusion preventive layer 60, which are sequentially stacked. Hereinafter, the pad and buried insulating layers 40, 50 will be referred to as an interlayer insulating layer 55. The interlayer insulating layer 55 may have one or more insulating layers. The interlayer insulating layer 55 may be silicon oxide ($SiO_2$) in accordance with some embodiments of the present invention. The diffusion preventive layer 60 may be an insulating layer having about the same etching ratio as that of the interlayer insulating layer 55. Alternatively, the diffusion preventive layer 60 may be an insulating layer having an etching ratio different from that of the interlayer insulating layer 55. The semiconductor substrate 10 may have p-type impurity ions.

Node conductive layer patterns 117 are disposed so as to extend upward from the diffusion preventive layer 60, and are respectively aligned to the node contact holes 75. The node conductive layer patterns 117 may comprise titanium (Ti), titanium nitride (TiN), and/or titanium aluminum nitride (TiAlN).

Lower electrodes 148 are disposed on the diffusion preventive layer 60 and cover the node conductive layer patterns 117, respectively. The lower electrodes 148 are configured such that their thicknesses are gradually reduced from the line extending the upper surfaces of the node conductive layer patterns 117 toward the diffusion preventive layer 60. That is, the lower electrodes 148 may have a distance S2 along the line extending from the upper surfaces of the node conductive layer patterns 117. Also, the lower electrodes 148 may have a distance S3 along the line extending from the lower surfaces of the node conductive layer patterns 117. The distance S3 may be smaller than a distance S1 between the node conductive layer patterns 117. The diffusion preventive layer 60 may be an insulating layer including titanium oxide (TiO) to improve the interface characteristics between the lower electrodes 148 and the interlayer insulating layer 55. The lower electrodes 148 may comprise a noble metal including iridium (Ir), platinum (Pt) or the like.

A dielectric layer 150 and an upper electrode 160 are sequentially disposed on the diffusion preventive layer 60 and cover the lower electrodes 148. The upper electrode 160 may comprise a noble metal including iridium (Ir), platinum (Pt) or the like. The dielectric layer 150 may be a ferroelectric material including PZT ($Pb(Zr_xTi_{1-x})O_3$). The lower and upper electrodes 148, 160 and the dielectric layer 150 interposed between the electrodes compose a capacitor 165.

Landing conductive layer patterns 96 are disposed to fully fill the node contact holes 75, respectively. Pad conductive layer patterns 30 are disposed under the lower portions of the landing conductive layer patterns 96, respectively, and at least contact the landing conductive layer patterns 96. The pad conductive layer patterns 30 may be disposed so as to be covered with the interlayer insulating layer 55. The landing conductive layer patterns 96 may contact the node conductive layer patterns 117 at upper portions of the node contact holes 75, respectively. The widths of the node conductive layer patterns 117 may be greater than the diameters D of the node contact holes 75. The node conductive layer patterns 117 may be spaced from each other by the distance S1.

Further, the distance S1 between the node conductive layer patterns 117 is smaller than that between the node contact holes 75.

Gate patterns 26 are disposed on the semiconductor substrate 10 between the pad conductive layer patterns 30, respectively. Gate spacers 29 are disposed on sidewalls of the gate patterns 26, respectively. The gate spacers 29 may be an insulating layer having an etching ratio different from that of the interlayer insulating layer 55. The gate spacers 29 may be silicon nitride ($Si_3N_4$). Each of the gate patterns 26 includes a gate 20 and a gate capping layer pattern 23, which are sequentially stacked. The gate capping layer pattern 23 may be an insulating layer having about the same etching ratio as that of the gate spacers 29. The gate 20 may comprise n-type polysilicon. The gate 20 may comprise n-type polysilicon and tungsten silicide (WSi), which are sequentially stacked.

In other embodiments of the invention, the landing conductive layer patterns 96 may be disposed so as to fill the lower portions of the node contact holes 75, respectively. The node conductive layer patterns 117 may be disposed to extend from the upper portions of the node contact holes 75 toward the semiconductor substrate 10 to fill the remaining portions of the node contact holes 75 and to contact the landing conductive layer patterns 96, respectively. The distance between the node conductive layer patterns 117 may be about equal to that between the node contact holes 75. The widths of the node conductive layer patterns 117 may be about equal to the diameters D of the node contact holes 75, respectively.

In other embodiments of the invention, the landing conductive layer patterns 96 may not be disposed in the node contact holes 75, respectively. Pad conductive layer patterns 30 are disposed under the node contact holes 75 and are covered with the interlayer insulating layer 55. The node conductive layer patterns 117 may be disposed so as to fully fill the node contact holes 75, respectively, and extend from the upper portions of the node contact holes 75 toward the semiconductor substrate 10 so as to be directly in contact with the pad conductive layer patterns 30, respectively. Also, the distance between the node conductive layer patterns 117 may be about equal to that between the node contact holes 75. The widths of the node conductive layer patterns 117 may be about equal to the diameters D of the node contact holes 75 respectively. In some embodiments of the invention, the pad conductive layer patterns 30 may be in contact with the semiconductor substrate 10.

Methods of forming FRAMS having lower electrodes respectively self-aligned to node conductive layer patterns according to some embodiments of the invention will now be described. FIGS. 3 through 19 are sectional views taken along line I-I' of FIG. 1, respectively, illustrating methods of forming a FRAM according to some embodiments of the invention.

Figure 3:
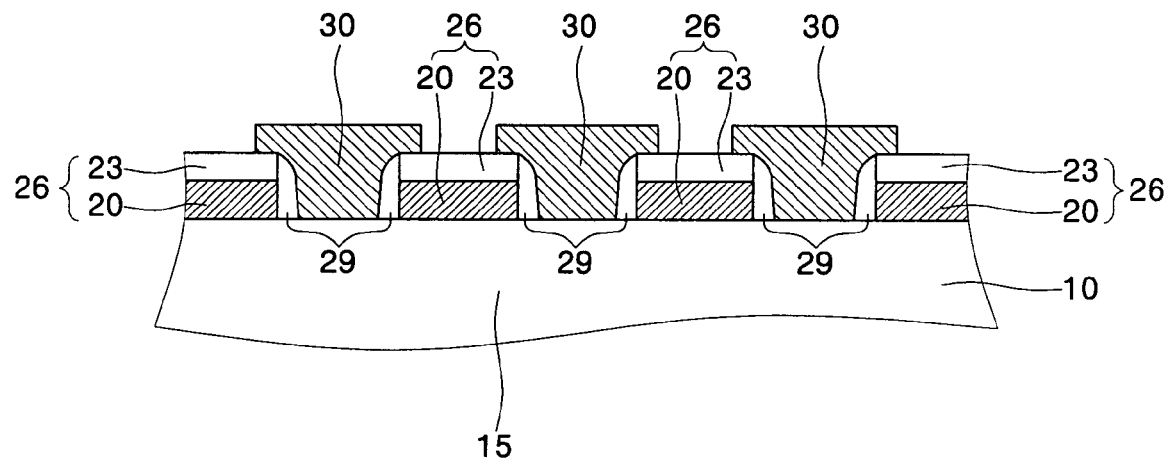
FIGS. 3 to 19 are cross-sectional views taken along line I-I' of FIG. 1 illustrating methods of forming a FRAM according to some embodiments of the invention, respectively.
Figure 4:
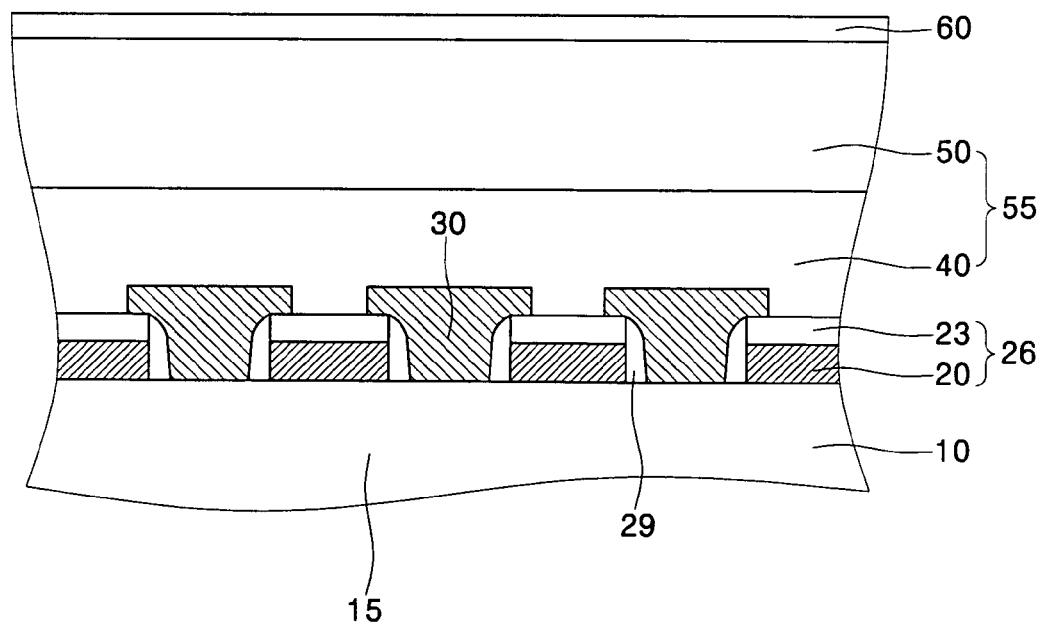

Referring to FIGS. 1, 3 and 4, a plurality of gate patterns 26 are formed on a semiconductor substrate 10. Gate spacers 29 are formed on sidewalls of the gate patterns 26, respectively. The pad conductive layer patterns 30 are formed between the gate patterns 26, respectively. The pad conductive layer patterns 30 are formed to contact the gate spacers 29, respectively. The gate spacers 29 may comprise an insulating layer having an etching ratio different from that of a silicon oxide ($SiO_2$). The gate spacers 29 may comprise silicon nitride ($Si_3N_4$). The pad conductive layer patterns 30 may comprise n-type polysilicon. Each of the gate patterns 26 is formed so as to have a gate 20 and a gate capping layer pattern 23, which are sequentially stacked. The gate capping layer pattern 23 may comprise an insulating layer having about the same etching ratio as that of the gate spacers 29. The gate 20 may comprise n-type polysilicon. The gate 20 may comprise n-type polysilicon and tungsten silicide (WSi), which are sequentially stacked.

A pad insulating layer 40 and a buried insulating layer 50 are sequentially stacked to cover the gate patterns 26 and the pad conductive layer patterns 30. The pad insulating layer 40 and the buried insulating layer 50 form an interlayer insulating layer 55. The interlayer insulating layer 55 may comprise an insulating layer having an etching ratio different from that of the gate capping layer pattern 23. The interlayer insulating layer 55 may comprise one or more insulating layers. The interlayer insulating layer 55 may comprise silicon oxide. A diffusion preventive layer 60 is formed on the interlayer insulating layer 55. The diffusion preventive layer 60 may comprise an insulating layer having about the same etching ratio as that of the interlayer insulating layer 55. The diffusion preventive layer 60 may comprise titanium oxide (TiO). The diffusion preventive layer 60 may comprise an insulating layer having an etching ratio different from that of the interlayer insulating layer 55.

Figure 5:
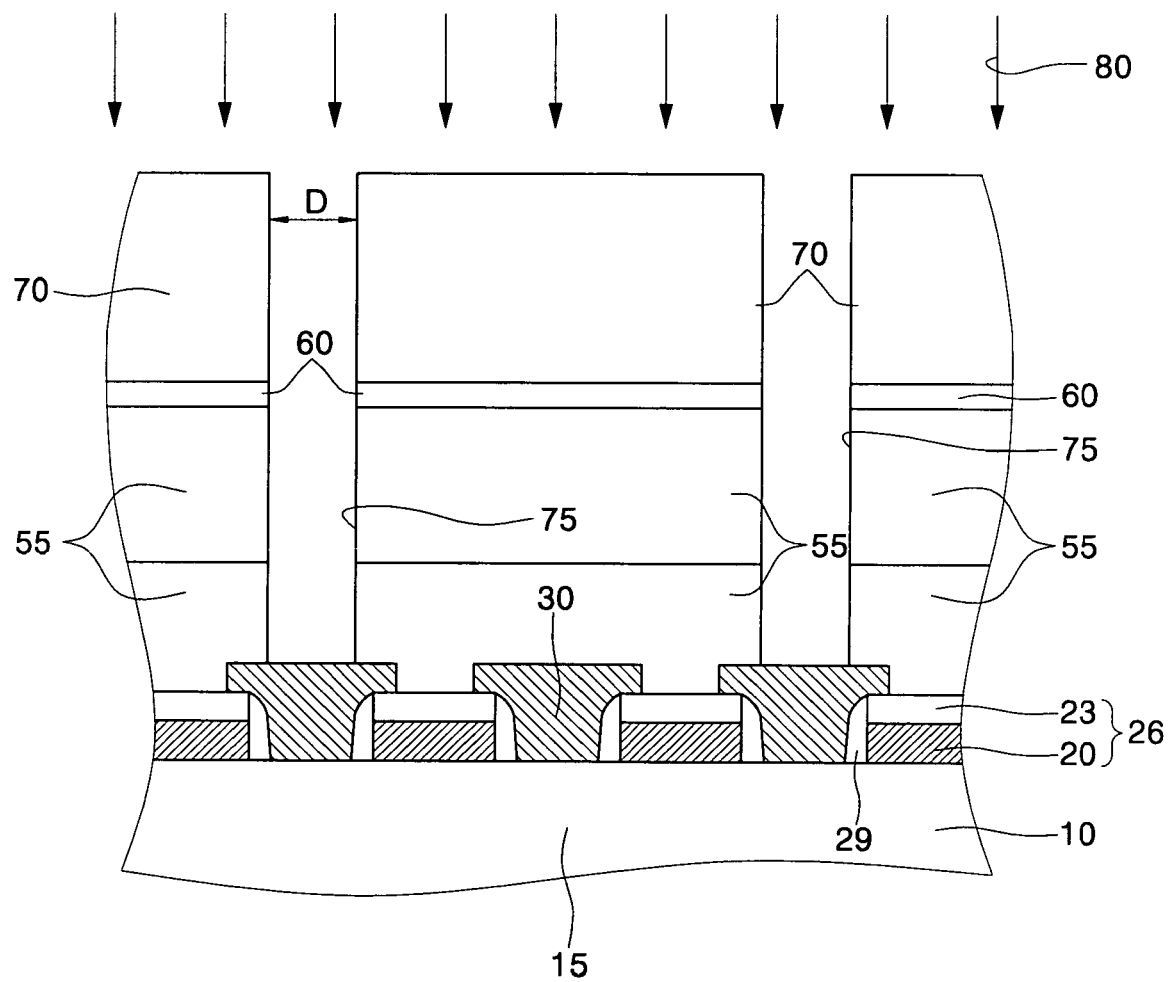
Figure 6:
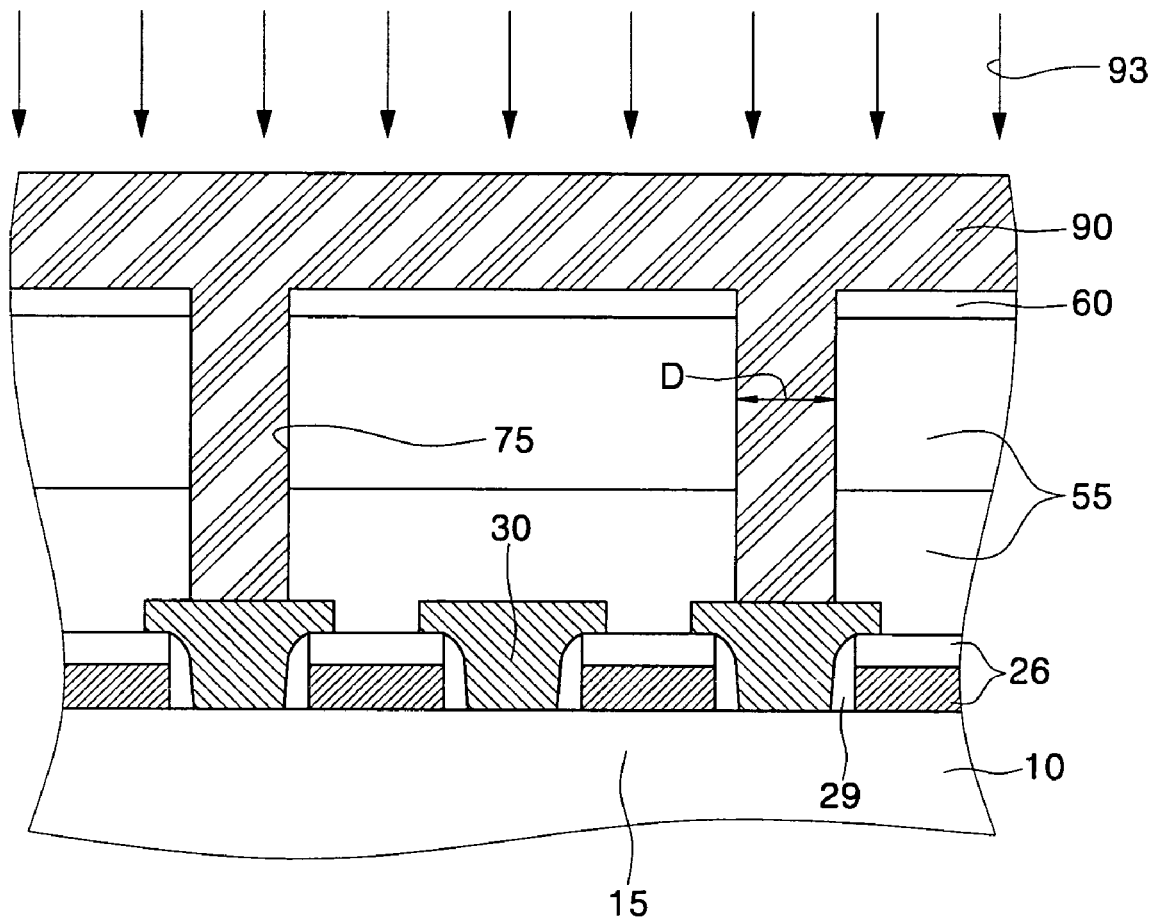

Referring to FIGS. 1, 5 and 6, photoresist patterns 70 are formed on the diffusion preventive layer 60. The photoresist patterns 70 may be formed so as to be spaced apart from each other by a predetermined distance D. By using the photoresist patterns 70 as an etching mask, an etching process 80 is sequentially performed in the diffusion preventive layer 60 and the interlayer insulating layer 55. The etching process 80 is performed such that node contact holes 75 penetrate the diffusion preventive layer 60 and the interlayer insulating layer 55, and at least expose the pad conductive layer patterns 30. After the formation of the node contact holes 75, the photoresist patterns 70 are removed from the semiconductor substrate. As such, the node contact holes 75 are formed to have a diameter D.

A landing conductive layer 90 is formed to fill the node contact holes 75 and to cover the diffusion preventive layer 60. The landing conductive layer 90 may comprise n-type polysilicon or tungsten. Then, by using the diffusion preventive layer 60 as an etching buffer layer, an etching process 93 is continuously performed on the landing conductive layer 90. The etching process 93 may be performed by using a chemical mechanical polishing technique.

Figure 7:
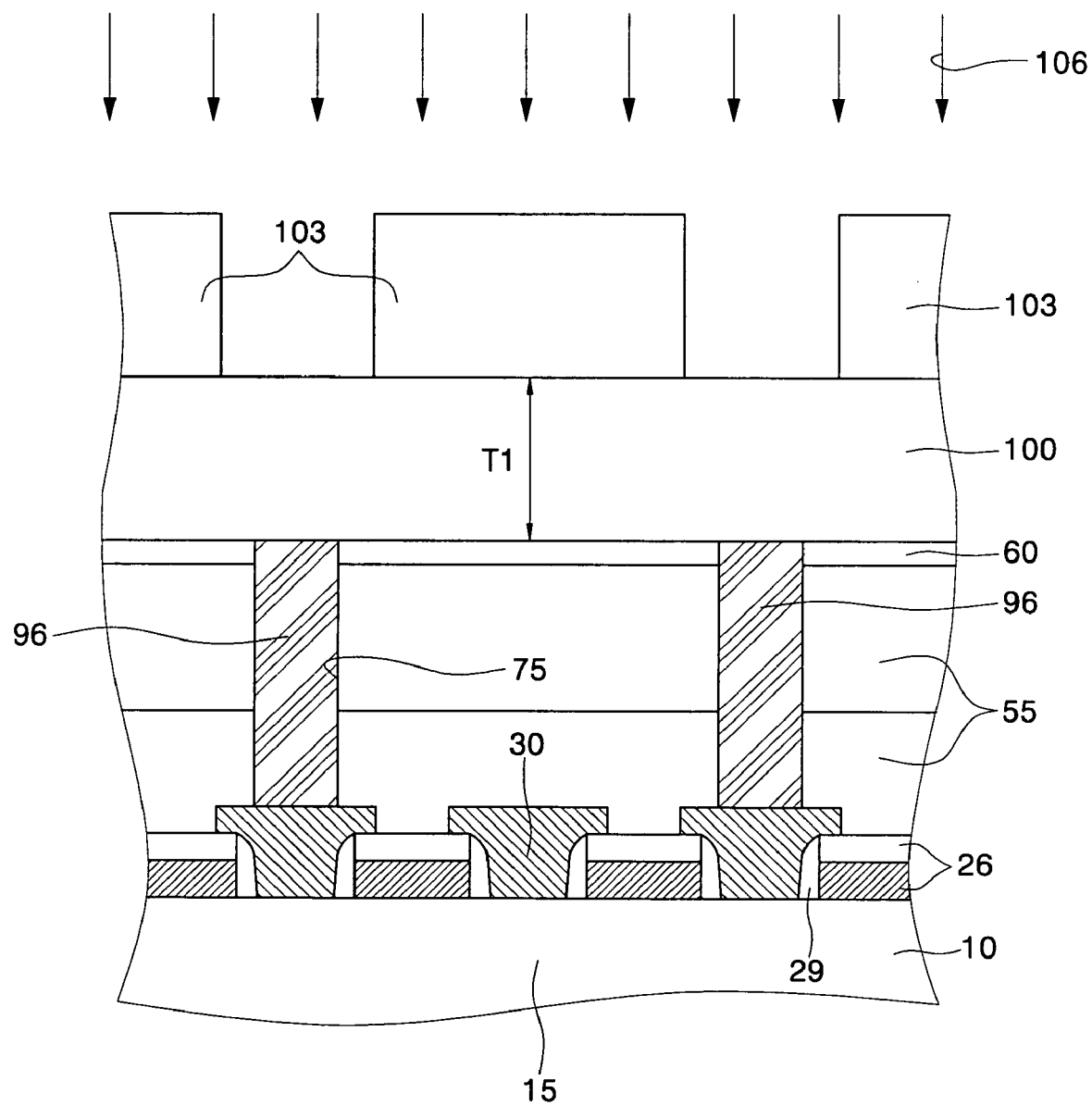

Referring to FIGS. 1 and 7, the etching process 93 exposes the diffusion preventive layer 60, and forms landing conductive layer patterns 96 to fully fill the node contact holes 75, respectively. The etching process 93 may be performed such that the upper surfaces of the landing conductive layer patterns 96 are disposed along the line extending the upper surfaces of the diffusion preventive layer 60.

Then, a sacrificial layer 100 is formed to have a predetermined thickness T1 to cover the landing conductive layer patterns 96 and the diffusion preventive layer 60. The sacrificial layer 100 may comprise an insulating layer having an etching ratio different from that of the diffusion preventive layer 60. Photoresist patterns 103 are formed on the sacrificial layer 100 and on the upper portions of the node contact holes 75. A distance between the photoresist patterns 103 may be formed to have a length greater than the diameter D of the node contact hole 75. By using the photoresist patterns 103 as an etching mask, an etching process 106 is continuously performed on the sacrificial layer 100.

Figure 8:
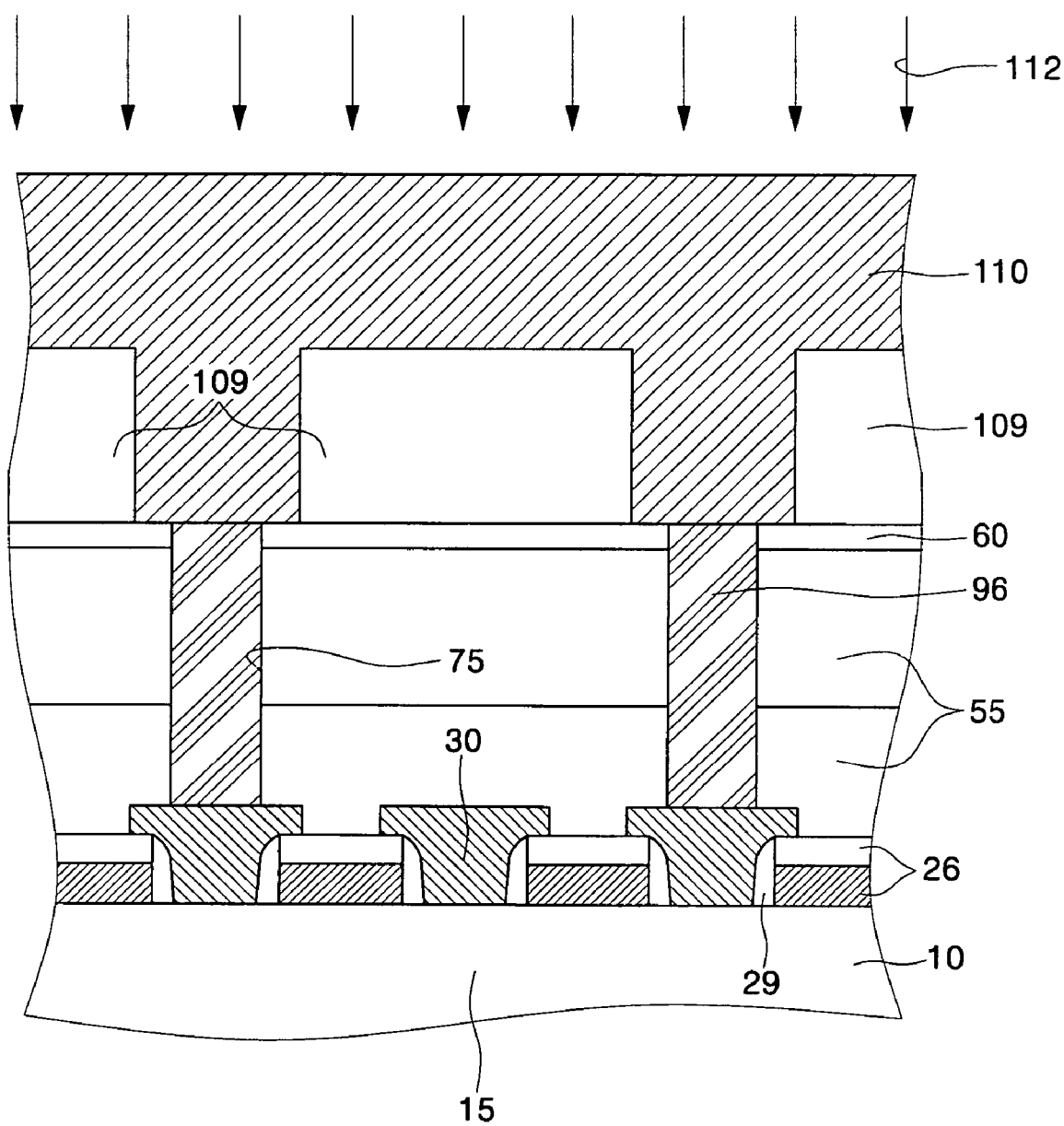
Figure 9:
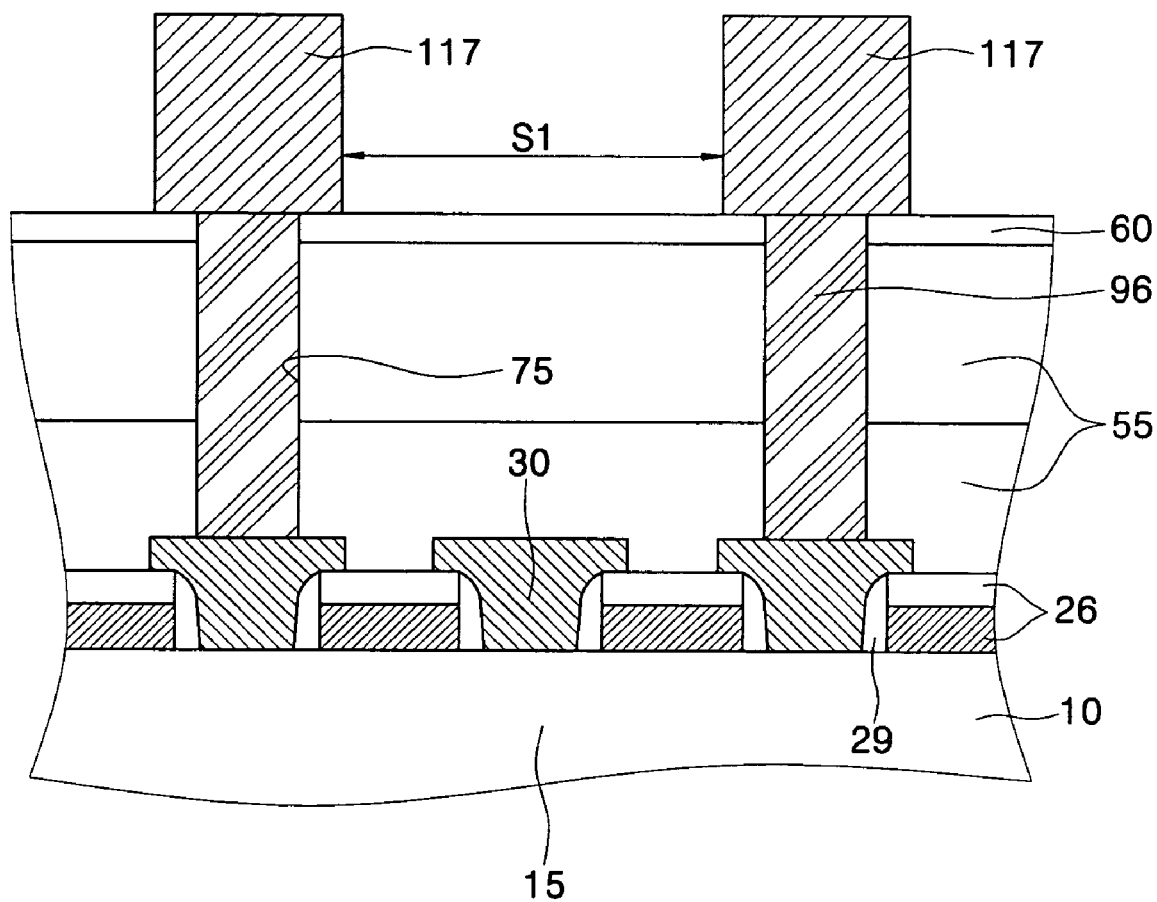

Referring to FIGS. 1, 8 and 9, sacrificial layer patterns 109 are formed on the diffusion preventive layer 60 through the etching process 106. The sacrificial layer patterns 109 expose the landing conductive layer patterns 96 and the diffusion preventive layer 60 around the node contact holes 75. After the formation of sacrificial layer patterns 109, the photoresist patterns 103 are removed from the semiconductor substrate 10.

A node conductive layer 110 is formed to cover the sacrificial layer patterns 109 and to contact the landing conductive layer patterns 96. The node conductive layer 110 may comprise titanium (Ti), titanium nitride (TiN) and/or titanium aluminum nitride (TiAlN).

By using the sacrificial layer patterns 109 as an etching buffer layer, an etching process 112 is performed on the node conductive layer 110. The etching process 112 may be performed by using a chemical mechanical polishing technique. The etching process 112 exposes the upper surfaces of the sacrificial layer patterns 109 to form node conductive layer patterns 117. The node conductive layer patterns 117 are formed between the sacrificial layer patterns 109 to contact the landing conductive layer patterns 96, respectively.

The sacrificial layer patterns 109 are removed from the semiconductor substrate 10 so that the node conductive layer patterns 117 are left on the diffusion preventive layer 60. The node conductive layer patterns 117 may be formed so as to be spaced from each other at a predetermined distance S1. The distance S1 between the node conductive layer patterns 117 may be smaller than that between the node contact holes 75. The widths of the node conductive layer patterns 117 may be greater than the diameters D of the node contact holes 75. The node conductive layer patterns 117 are formed with recessed shapes by using the sacrificial layer patterns 109.

Methods of forming the node conductive layer patterns 117 with protruded shapes, in accordance with some embodiments of the present invention, will be described with reference to FIGS. 10 and 11. The elements from the gate patterns 26 to the landing conductive layer patterns 96, including the diffusion preventive layer 60 of FIG. 10, can be formed as described above with reference to FIGS. 3 to 7.

Figure 10:
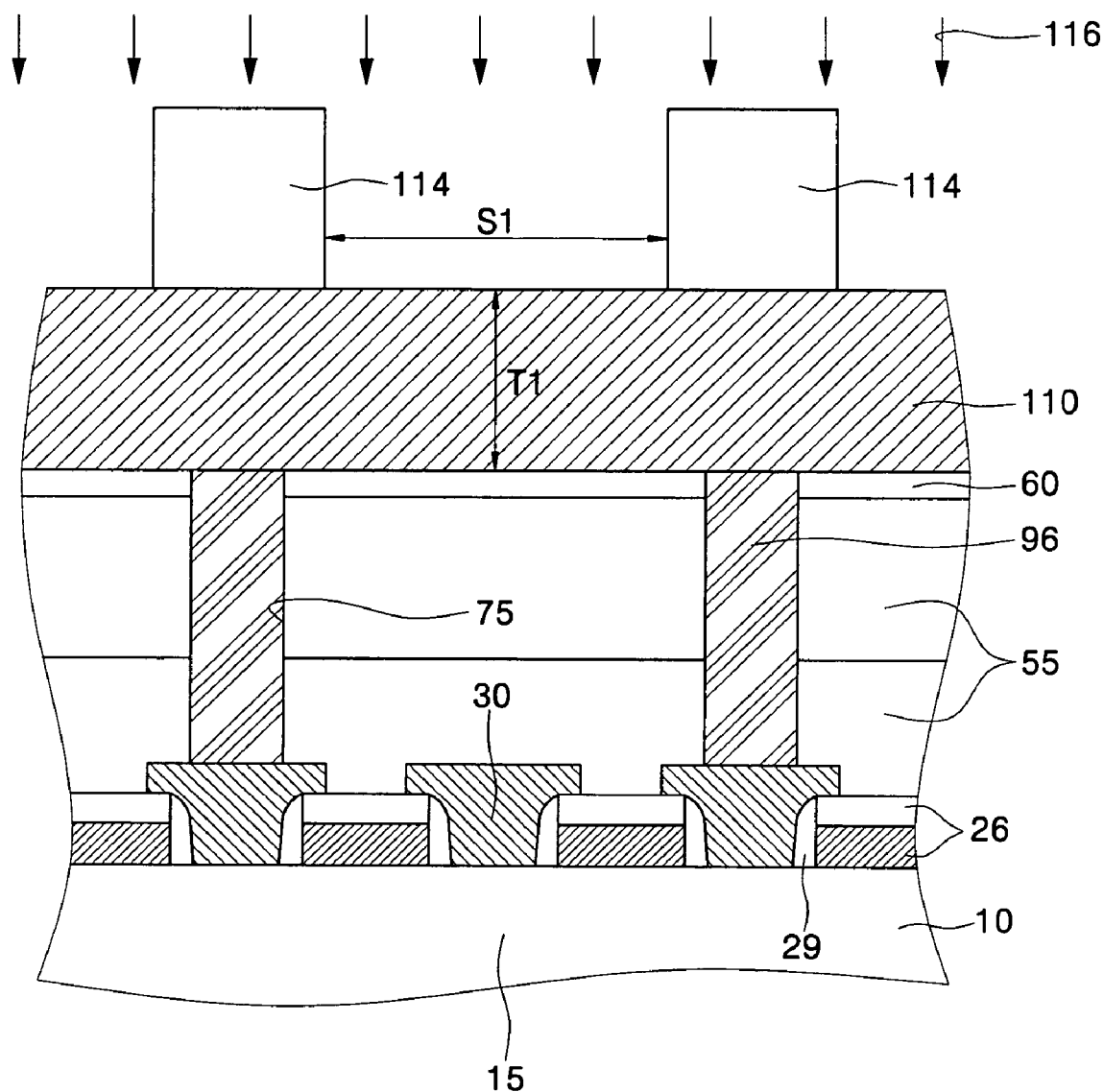
Figure 11:
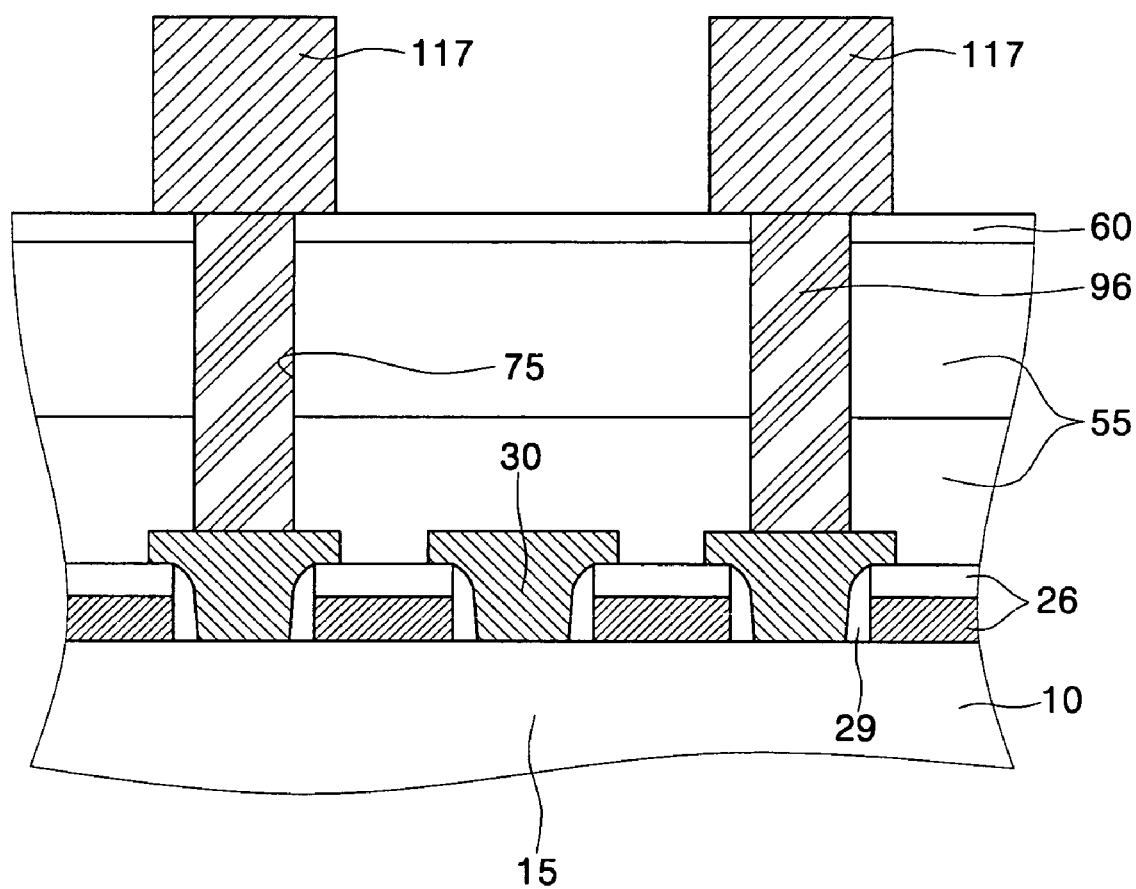

Referring to FIGS. 1, 10, and 11, a node conductive layer 110 is formed on the sacrificial layer patterns 109 to cover the landing conductive layer patterns 96 and the diffusion preventive layer 60. The node conductive layer 110 may comprise titanium (Ti), titanium nitride (TiN) and/or titanium aluminum nitride (TiAlN). The node conductive layer 110 may have about the same thickness as the thickness T1 of the sacrificial layer of FIG. 7.

Photoresist patterns 114 are formed on the node conductive layer 110 to overlap node contact holes 75, respectively. The widths of the photoresist patterns 114 may be greater than the diameters D of the node contact holes 75. The distance between the photoresist patterns 114 may be about equal to the distance S1 between the node conductive layer patterns 117 of FIG. 9.

Then, by using the photoresist patterns 114 as an etching mask, an etching process 116 is performed on the node conductive layer 110. The etching process 116 forms node conductive layer patterns 117 under the photoresist patterns 114, respectively. The distance between the node conductive layer patterns 117 is less than that between the node contact holes 75. The widths of the node conductive layer patterns 117 may be greater than the diameters D of the node contact holes 75. After the formation of node conductive layer patterns 117, the photoresist patterns 114 are removed from the semiconductor substrate 10.

Methods of forming the node conductive layer patterns 117 on an upper of the semiconductor substrate 10, in accordance with some embodiments of the present invention, will be described with reference to FIGS. 12 to 15. The elements from the gate patterns 26 to the diffusion preventive layer 60 can be formed as described above with reference to FIGS. 3 and 4.

Figure 12:
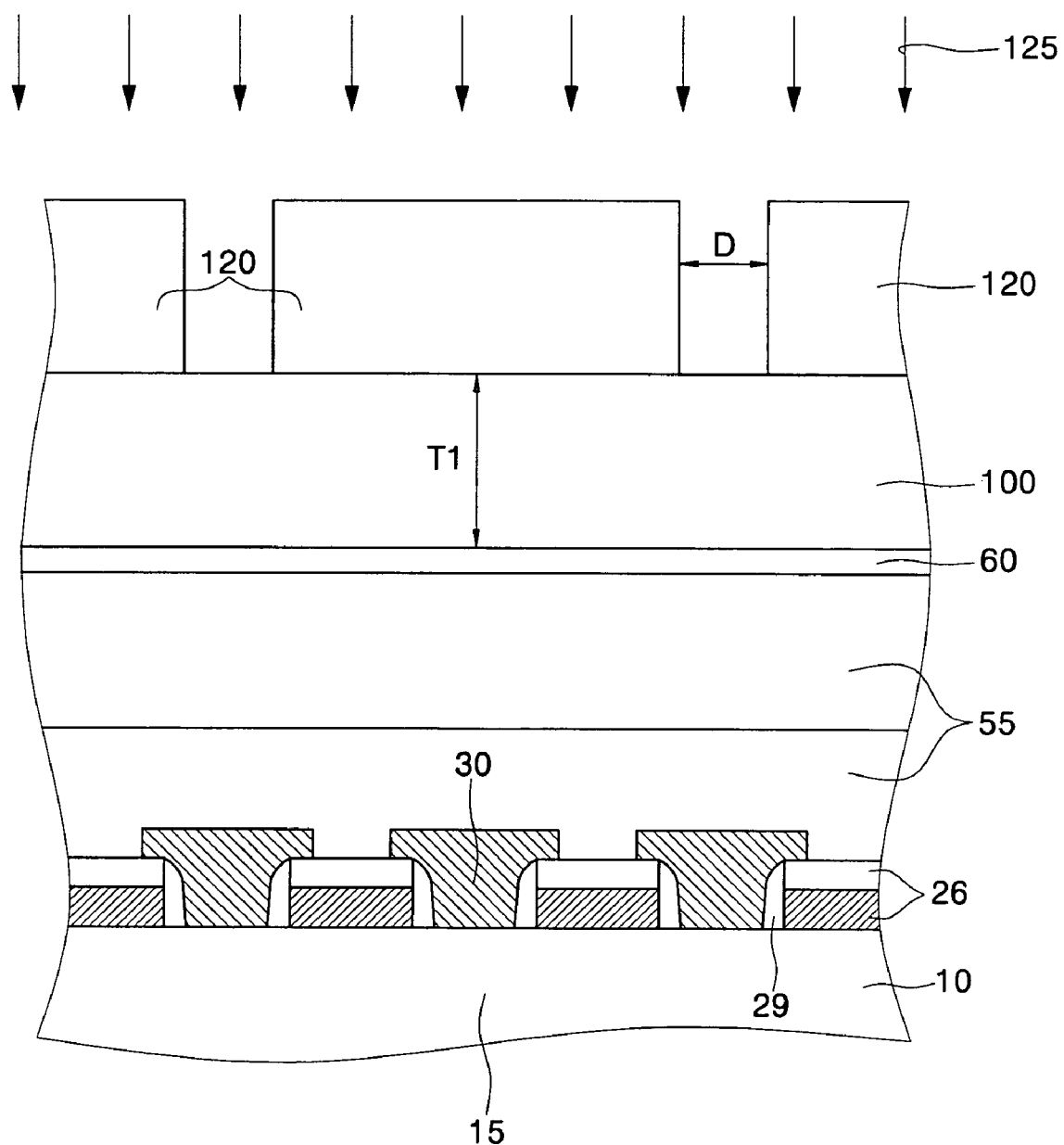
Figure 13:
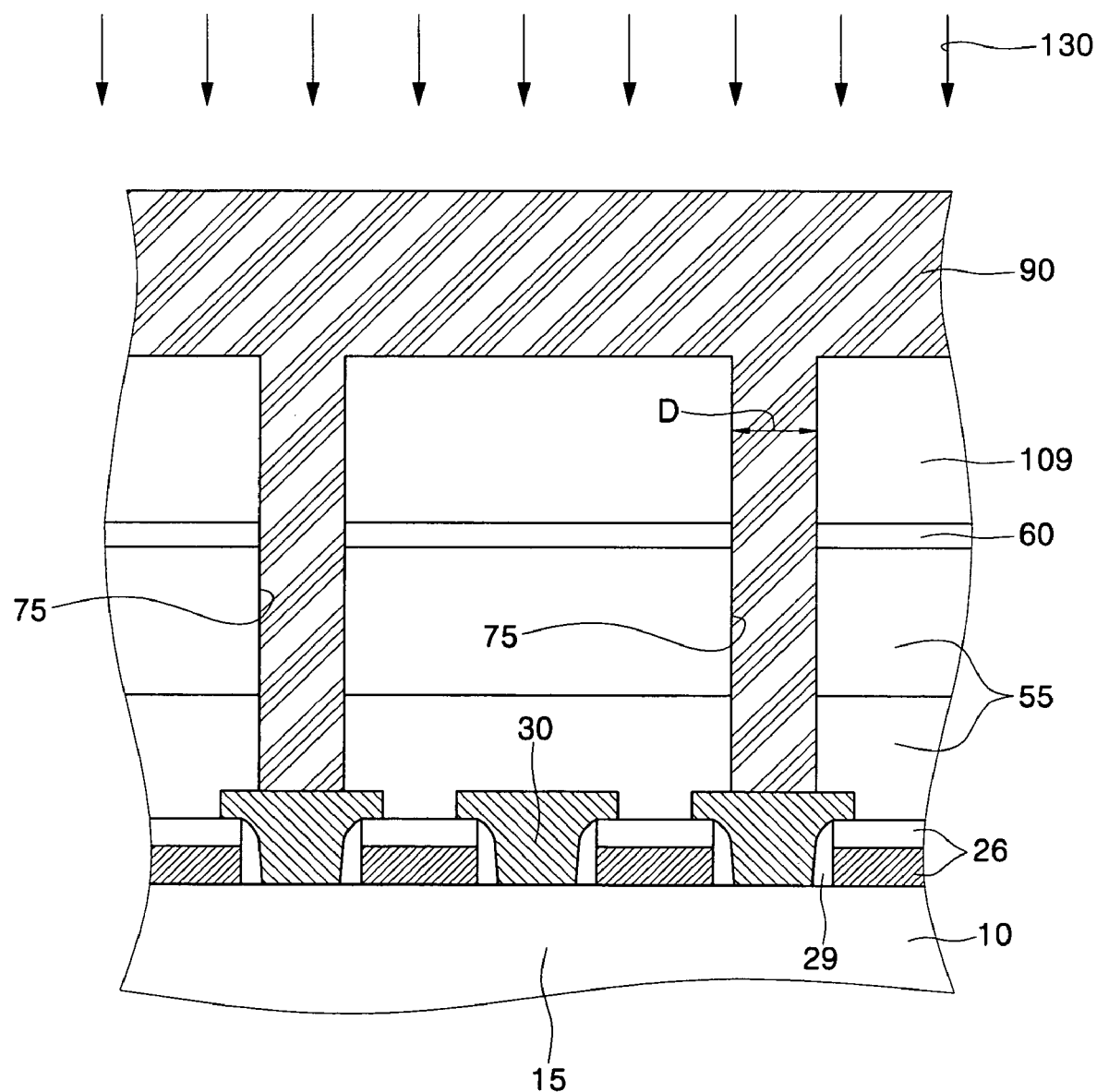

Referring to FIGS. 1, 12, and 13, a sacrificial layer 100 is formed on the diffusion preventive layer 60. Photoresist patterns 120 are formed on the sacrificial layer 100. The distance between the photoresist patterns 120 may be about the same length D as that of the photoresist patterns 70 of FIG. 5. The sacrificial layer 100 may have about the same thickness T1 as that of FIG. 7. The sacrificial layer 100 may comprise an insulating layer having an etching ratio different from that of the diffusion preventive layer 60.

By using the photoresist patterns 120 and the diffusion preventive layer 60 as an etching mask and an etching buffer layer, respectively, an etching process 125 is performed on the sacrificial layer 100. The etching process 125 forms sacrificial layer patterns 109 on the diffusion preventive layer 60. By using the photoresist patterns 120 and the sacrificial layer patterns 109 as an etching mask, the etching process 125 can be continuously performed in the diffusion preventive layer 60 and the interlayer insulating layer 55. The etching process 125 forms node contact holes 75 sequentially penetrating the diffusion preventive layer 60 and the interlayer insulating layer 55 so as to at least expose the pad conductive layer patterns 30. By using the photoresist patterns 120 as an etching mask, the etching process 125 can be concurrently performed in the sacrificial layer 100, the diffusion preventive layer 60, and the interlayer insulating layer 55.

After the formation of the node contact holes 75, the photoresist patterns 120 are removed from the semiconductor substrate 10. A landing conductive layer 90 is formed on the sacrificial layer patterns 109 to fill the node contact holes 75. The landing conductive layer 90 may comprise n-type polysilicon and/or tungsten. An etching process 130 is performed on the landing conductive layer 90.

After the formation of the sacrificial layer patterns 109, the photoresist patterns 120 may be removed from the semiconductor substrate 10. At this time, the etching process 125 can be sequentially performed in the diffusion preventive layer 60 and the interlayer insulating layer 55 by using the sacrificial layer patterns 109 as an etching mask.

Figure 14:
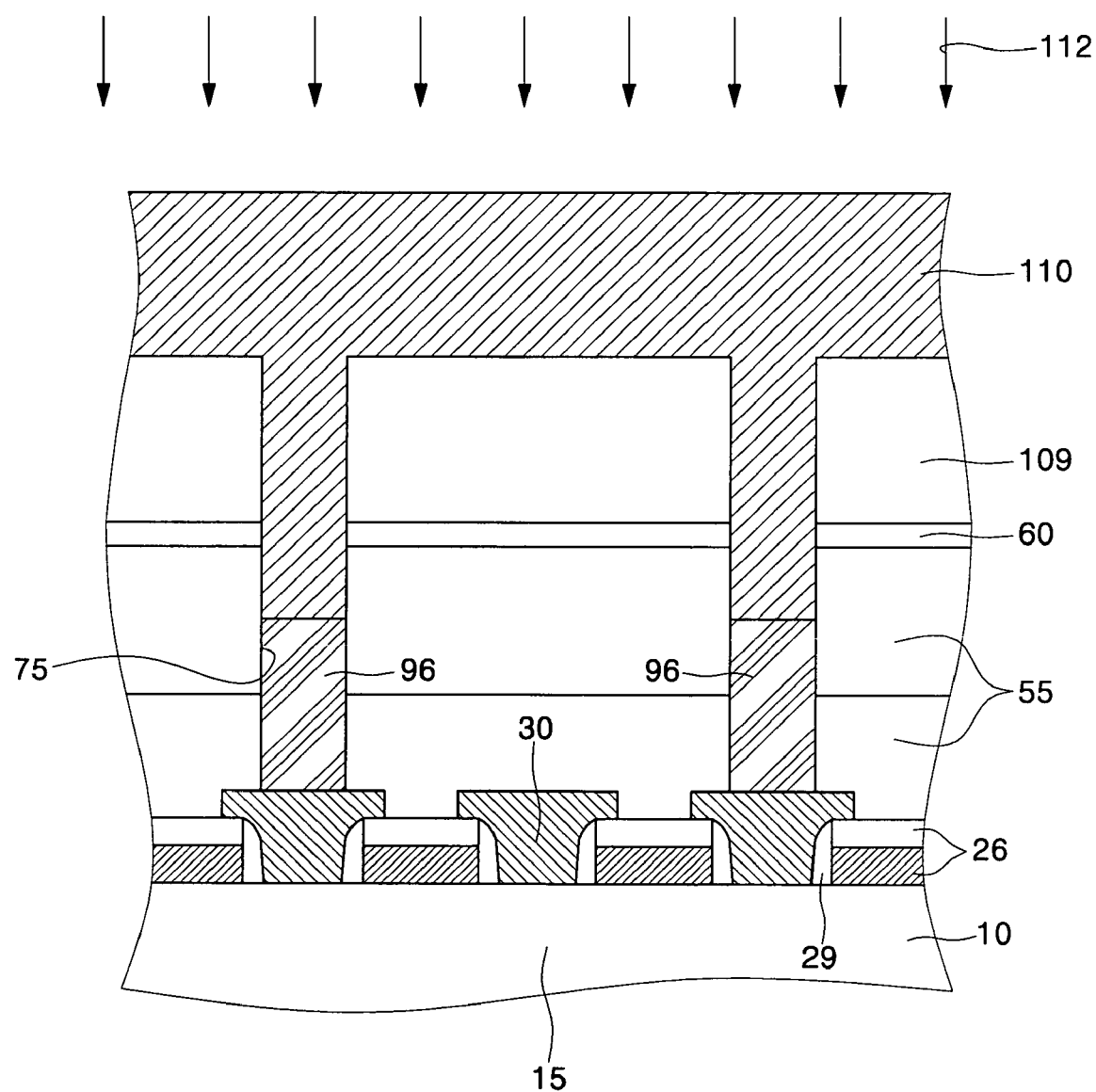
Figure 15:
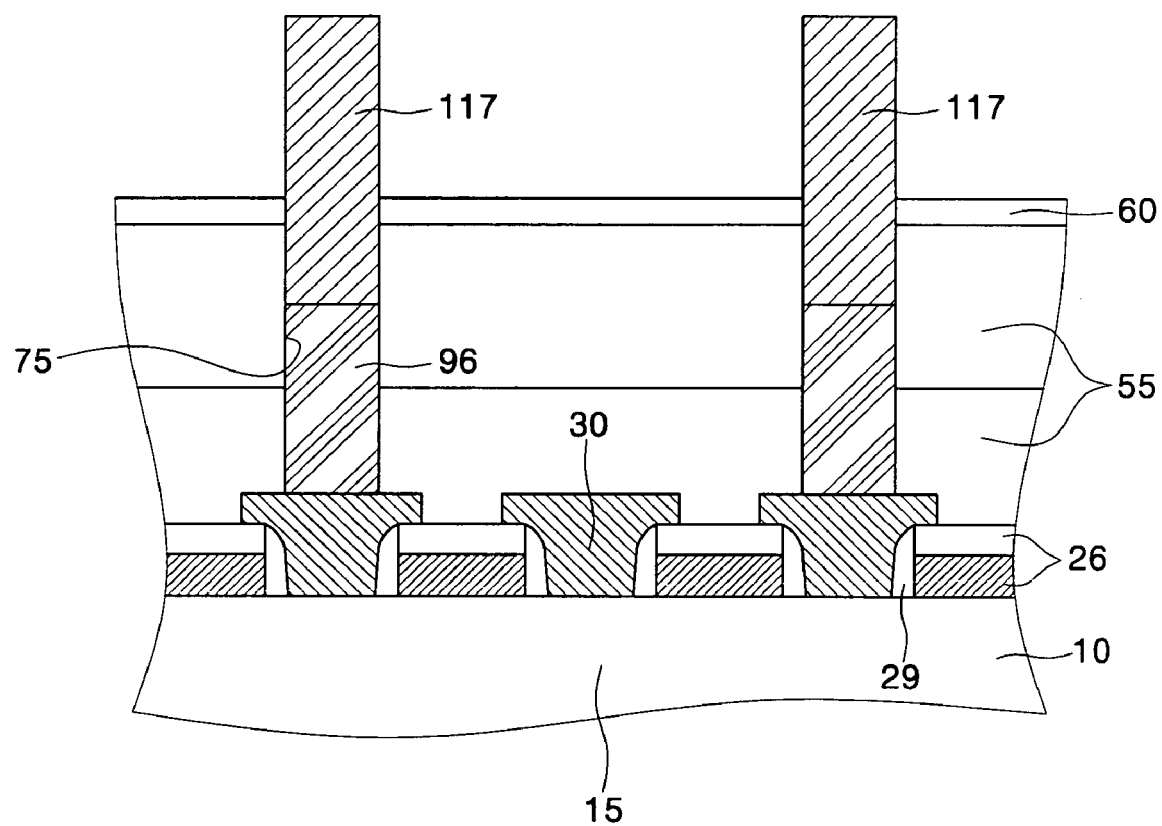

Referring to FIGS. 1, 14, and 15, the etching process 130 partially removes the landing conductive layer 90 to expose the sacrificial layer patterns 109. The etching process 130 forms landing conductive layer patterns 96 to respectively fill the lower portions of the node contact holes 75. The etching process 130 may be performed by using an etching-back technique. A node conductive layer 110 is formed to fill the remaining portions of the node contact holes 75 and cover the sacrificial layer patterns 109. The node conductive layer 110 may comprise titanium (Ti), titanium nitride (TiN), and/or titanium aluminum nitride (TiAlN).

Then, an etching process 112 is continuously performed on the node conductive layer 110 until the sacrificial layer patterns 109 are exposed. The etching process 112 may be performed by using a chemical mechanical polishing technique. The etching process 112 forms node conductive layer patterns 117 on the node contact holes 75, respectively. The node conductive layer patterns 117 contact the landing conductive layer patterns 96, respectively. The distance between the node conductive layer patterns 117 is about equal to that between the node contact holes 75. The widths of the node conductive layer patterns 117 may be about equal to the diameters D of the node contact holes 75, respectively. The upper surfaces of the node conductive layer patterns 117 may be formed along the line extending the upper surfaces of the sacrificial layer patterns 109. After the formation of the node conductive layer patterns 117, the sacrificial layer patterns 109 are removed from the semiconductor substrate 10. The node conductive layer patterns 117 are formed to respectively contact the upper surfaces of the landing conductive layer patterns 96 inside the node contact holes 75, and to extend upward from the diffusion preventive layer 60.

Methods of forming the node conductive layer patterns 117 on the upper of the semiconductor substrate 10, in accordance with other embodiments of the present invention, will be described with reference to FIGS. 16 and 17. The elements from the gate patterns 26 to the node contact holes 75, including the sacrificial layer patterns 109 of FIG. 16, may be formed as described above with reference to FIGS. 3, 4, 12, and 13.

Figure 16:
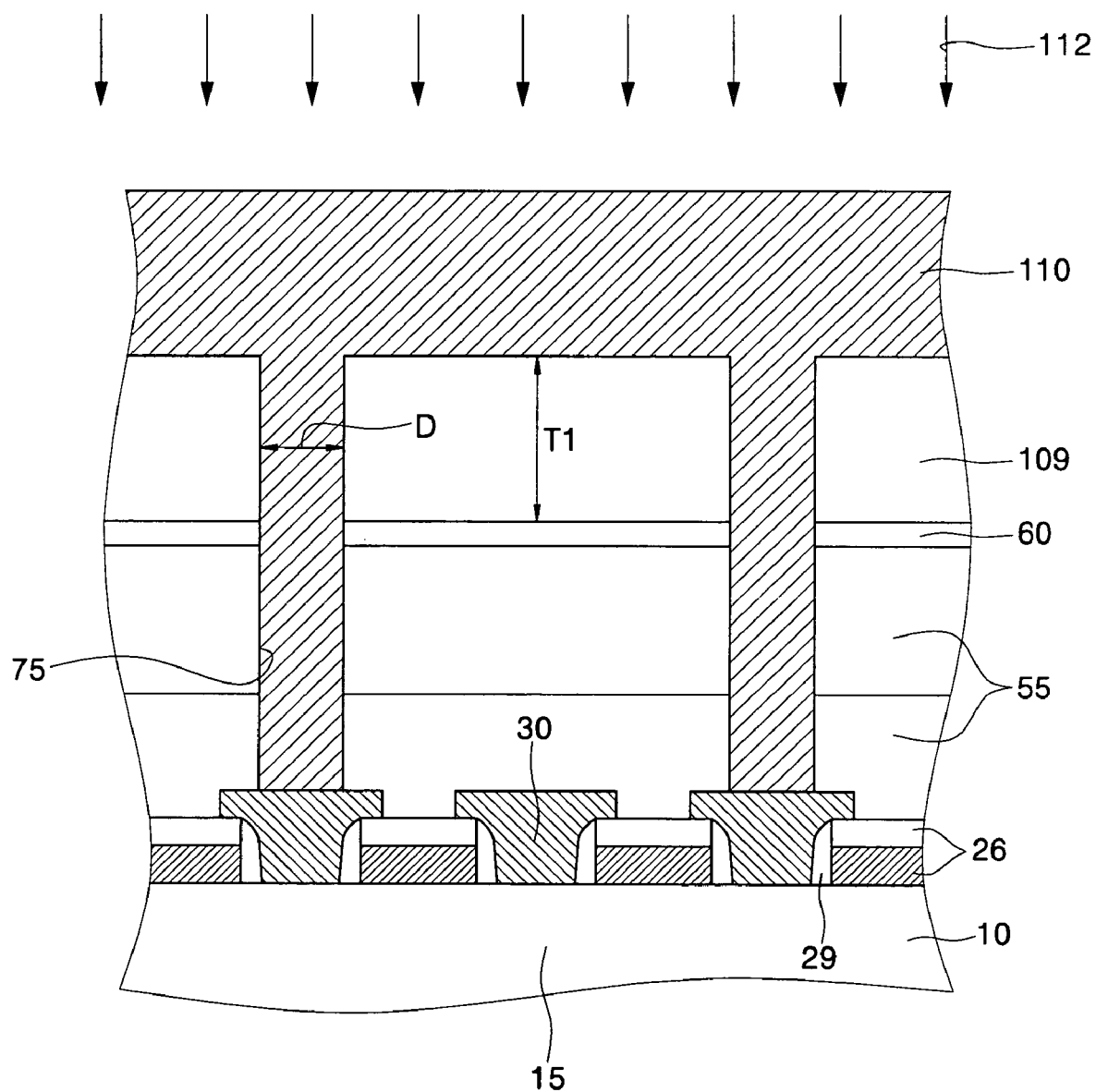
Figure 17:
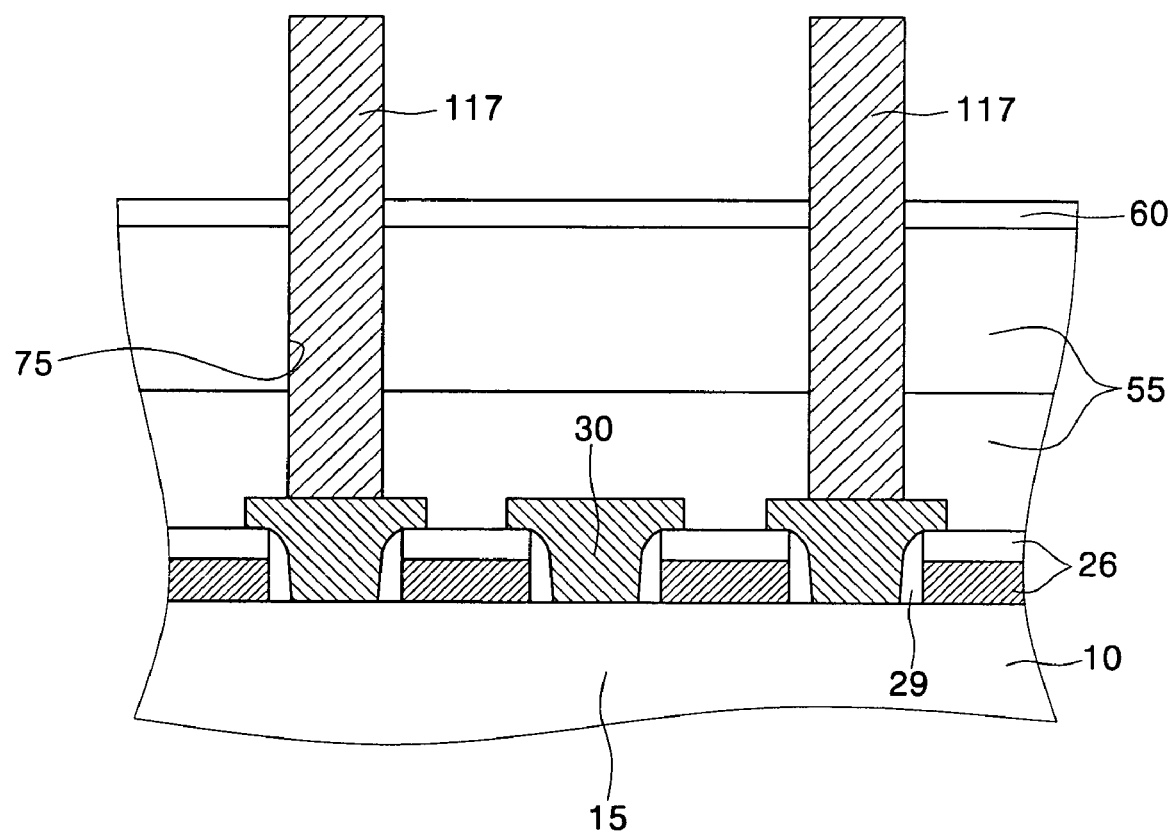

Referring to FIGS. 1, 16, and 17, a node conductive layer 110 is formed to cover the sacrificial layer patterns 109 to fully fill the node contact holes 75. The node conductive layer 110 is directly in contact with the pad conductive layer patterns 30 through the node contact holes 75. The node conductive layer 110 may comprise titanium (Ti), titanium nitride (TiN), and/or titanium aluminum nitride (TiAlN). The sacrificial layer patterns 109 may have about the same thickness T1 as that of FIG. 7.

An etching process 112 is performed on the node conductive layer 110. The etching process 112 may be performed by using a chemical mechanical polishing technique. The etching process 112 may be performed until the sacrificial layer patterns 109 are exposed. The etching process 112 forms node conductive layer patterns 117 in the node contact holes 75, respectively. The distance between the node conductive layer patterns 117 is about equal to that between the node contact holes 75. The widths of the node conductive layer patterns 117 may be about equal to the diameters D of the node contact holes 75. The upper surfaces of the node conductive layer patterns 117 may be formed along the line extending the upper surfaces of the sacrificial layer patterns 109. After the formation of the node conductive layer patterns 117, the sacrificial layer patterns 109 are removed from the semiconductor substrate 10. The node conductive layer patterns 117 are formed to respectively contact the upper surfaces of the pad conductive layer patterns 30 to extend upward from the diffusion preventive layer 60.

Figure 18:
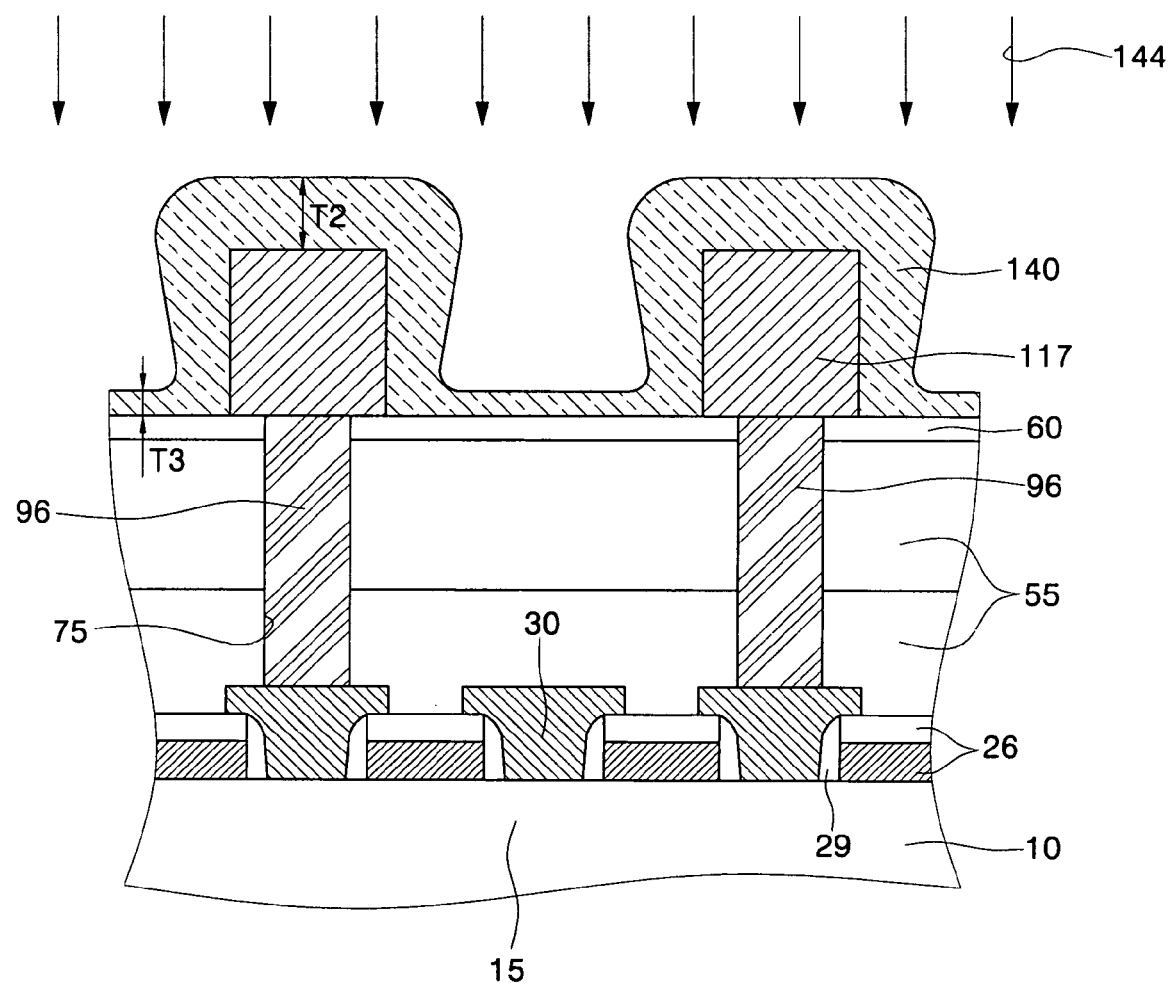
Figure 19:
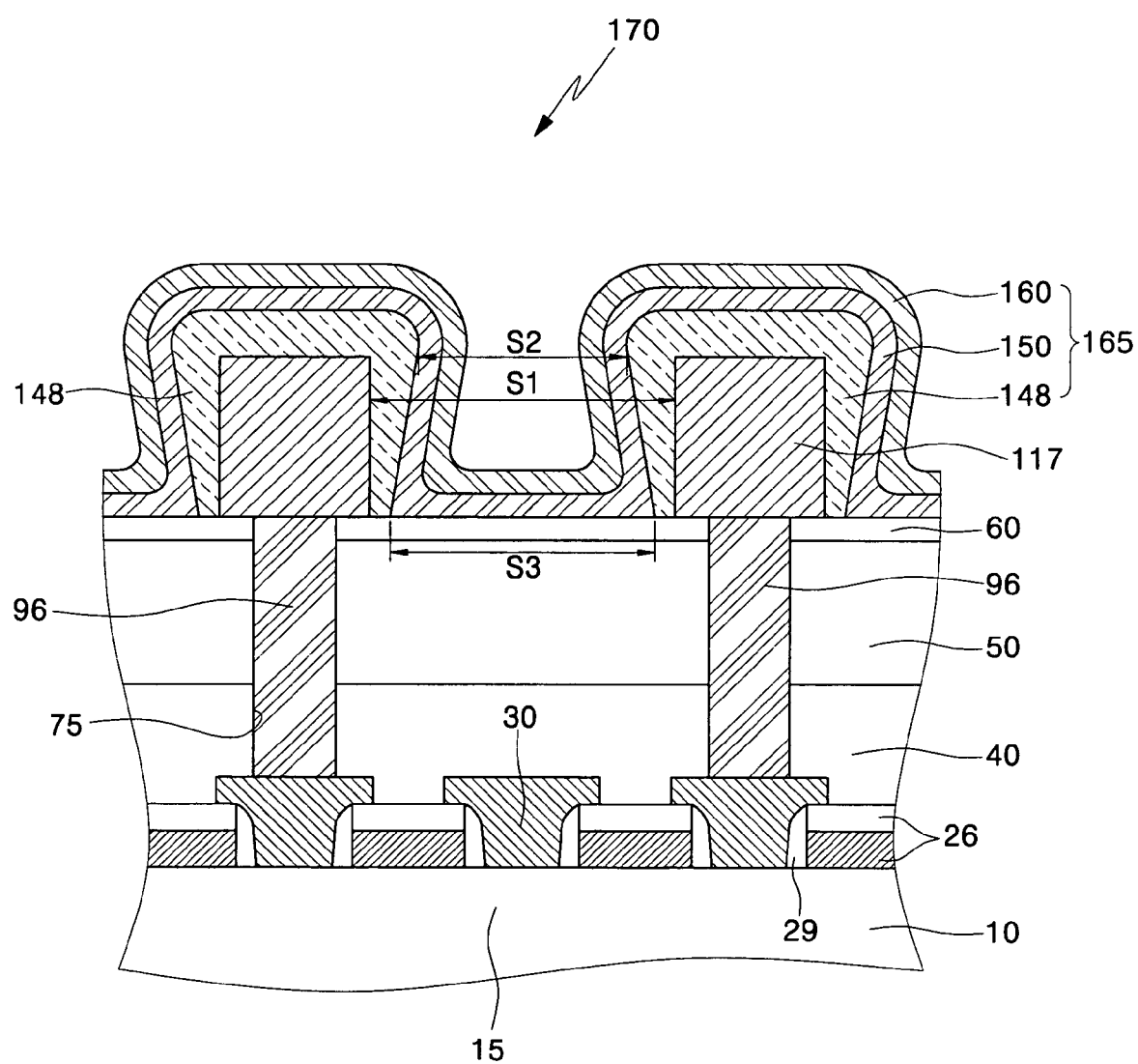

Methods of forming capacitors respectively covering the node conductive layer patterns 117, according to some embodiments of the present invention, will be described with reference to FIGS. 9, 18, and 19. Referring to FIGS. 1, 18, and 19, a lower electrode layer 140 is formed on the diffusion preventive layer 60 to cover the node conductive layer patterns 117. The lower electrode layer 140 is formed on the node conductive layer pattern 117 and the diffusion preventive layer 60 with thicknesses T2 and T3, respectively. Further, the lower electrode layer 140 may be formed such that its thickness is gradually reduced along sidewalls of the node conductive layer pattern 117. The lower electrode layer 140 may comprise a noble metal including iridium (Ir), platinum (Pt), or the like.

An etching process 144 is performed on a whole surface of the lower electrode layer 140 to expose the diffusion preventive layer 60. The etching process 144 exposes the diffusion preventive layer 60 by using a thickness difference of the lower electrode layer 140 covering the node conductive layer patterns 117. Therefore, the etching process 140 node-separates the lower electrode layer 140, thereby forming lower electrodes 148 covering the node conductive layer patterns 117, respectively. The lower electrodes 148 preferably have a distance S2 along a line extending the upper surfaces of the node conductive layer patterns 117. Also, the lower electrodes 148 may have a distance S3 along a line extending the lower surfaces of the node conductive layer patterns 117. The distance S3 between the lower electrodes 148 may be smaller than the distance S1 between the node conductive layer patterns 117. The diffusion preventive layer 60 may comprise an insulating layer including titanium oxide (TiO) to improve interface characteristics between the lower electrodes 148 and the interlayer insulating layer 55.

The etching process 144 may be performed by using multiple steps for the node separation of the lower electrode layer 140 as follows: The etching process 144 may include a first operation of etching and pumping for easily volatizing the by-products generated during the performance of the etching process 144, a second operation of purging, etching, and pumping, and a third operation of purging, and the operations are sequentially performed. The etching process 144 may be performed by applying heat to the substrate 10 so that the substrate 10 has a predetermined temperature or higher to facilitate easy volatization of the by-products. Further, the etching process 144 may be performed by controlling a pressure and a pumping speed so that the by-products during the etching process 144 can be vaporized on the semiconductor substrate 10 and eliminated from the semiconductor substrate 10. The by-products are reactants of the lower electrode layer 140 and an etching process gas.

Then, a dielectric layer 150 and an upper electrode 160 are sequentially formed on the diffusion preventive layer 60 to cover the lower electrodes 148. The upper electrode 160 may comprise a noble metal, such as, for example, iridium (Ir), platinum (Pt), or the like. The dielectric layer 150 may comprise a ferroelectric material including PZT (Pb($Zr_xT_{1-x}$)$O_3$). A capacitor 165 is formed on the upper of the semiconductor substrate 10 by using the lower and upper electrodes 148, 160 and the dielectric layer 150 interposed between the electrodes. As such, a FRAM 170, according to some embodiments of the invention, can be formed. Further, capacitors covering the node conductive layer patterns 117 can be formed as shown in FIGS. 18 and 19, in accordance with other embodiments of the invention.

As described above, some embodiments of the invention provide methods that may simplify semiconductor fabrication processes for forming lower electrodes respectively self-aligned to node conductive layer patterns. Therefore, some embodiments of the invention may meet the market demand for a semiconductor device having lower electrodes that satisfy a reduction of a design rule for the semiconductor device.

Some embodiments of the invention provide ferroelectric random access memories having lower electrodes respectively self-aligned to node conductive layer patterns and methods of forming the same.

According to some embodiments of the invention, there are provided ferroelectric random access memories having lower electrodes respectively self-aligned to node conductive layer patterns that include two node contact holes penetrating an interlayer insulating layer and a diffusion preventive layer stacked thereon over a semiconductor substrate. Node conductive layer patterns are aligned to the node contact holes, respectively, and are disposed so as to protrude upward from the diffusion preventive layer. Lower electrodes are disposed on the diffusion preventive layer to cover the node conductive layer patterns, respectively. At this time, thicknesses of the lower electrodes are gradually reduced from a line extending from upper surfaces of the node conductive layer patterns toward the diffusion preventive layer.

According to other embodiments of the invention, there are provided methods of forming ferroelectric random access memories having lower electrodes respectively self-aligned to node conductive layer patterns that include forming two node contact holes, which are isolated by an interlayer insulating layer and a diffusion preventive layer stacked thereon on a semiconductor substrate. Node conductive layer patterns are formed so as to protrude upward from the diffusion preventive layer and are aligned with the node contact holes, respectively. A lower electrode layer covers the node conductive layer patterns on the diffusion preventive layer, respectively. An etching process is performed on a whole surface of a lower electrode layer to expose the diffusion preventive layer, and the etching process node-separates the lower electrode layer, thereby forming lower electrodes respectively covering the node conductive layer patterns. The lower electrode layer is formed to have different thicknesses on upper surfaces of the node conductive layer pattern and the diffusion preventive layer, and, concurrently, is formed such that its thickness is gradually reduced along sidewalls of the node conductive layer patterns.

In concluding the detailed description, it should be noted that many variations and modifications can be made to the embodiments without substantially departing from the principles of the present invention. All such variations and modifications are intended to be included herein within the scope of the present invention, as set forth in the following claims.

That which is claimed:

1. A method of forming a FRAM, comprising:
   providing a semiconductor substrate;
   forming an interlayer insulating layer on the substrate;
   forming a diffusion preventive layer on the interlayer insulating layer;
   forming two node contact holes in the diffusion preventive layer and the interlayer insulating layer;
   forming node conductive layer patterns that protrude upward from the diffusion preventive layer and are aligned with the node contact holes, respectively; and
   forming a lower electrode layer that covers the node conductive layer patterns on the diffusion preventive layer; and
   etching a surface of the lower electrode layer so as to expose the diffusion preventive layer and to separate the lower electrode layer, thereby forming lower electrodes respectively covering the node conductive layer patterns;
   wherein the lower electrode layer is formed to have different thicknesses on upper surfaces of the node conductive layer pattern and the diffusion preventive layer, and is further formed such that its thickness is gradually reduced along sidewalls of the node conductive layer patterns.

2. The method according to claim 1, wherein the lower electrode layer comprises a noble metal comprising iridium (Ir) and/or platinum (Pt).

3. The method according to claim 1, wherein the node conductive layer patterns comprise titanium (Ti), titanium nitride (TiN), and/or titanium aluminum nitride (TiAlN).

4. The method according to claim 1, wherein the diffusion preventive layer comprises an insulating layer comprising a titanium oxide (TiO) layer.

5. The method according to claim 1, wherein the interlayer insulating layer comprises at least one insulating layer.

6. The method according to claim 1, further comprising:
   forming a dielectric layer on the lower electrode; and
   forming an upper electrode on the dielectric layer.

7. The method according to claim 6, wherein the dielectric layer comprises a ferroelectric material comprising PZT ($Pb(Zr_xTi_{1-x})O_3$).

8. The method according to claim 6, wherein the upper electrode comprises a noble metal comprising iridium (Ir) and/or platinum (Pt).

9. The method according to claim 1, further comprising:
   forming pad conductive layer patterns under the node contact holes, the pad conductive layers being covered with the interlayer insulating layer; and
   forming gate patterns on the semiconductor substrate between the pad conductive layer patterns;
   wherein the pad conductive layer patterns are formed so as to contact the semiconductor substrate, the node conductive layer patterns are formed so as to extend toward the semiconductor substrate to fully fill the node contact holes, respectively, to contact the pad conductive layer patterns, and a distance between the node conductive layer patterns is about equal to that between the node contact holes.

10. The method according to claim 9, wherein widths of the node conductive layer patterns are about equal to diameters of the node contact holes, respectively.

* * * * *